United States Patent
Matsuzawa

(10) Patent No.: US 7,626,517 B2
(45) Date of Patent: Dec. 1, 2009

(54) DATA RETRIEVING METHOD, DATA RETRIEVING APPARATUS, DATA COMPRESSION METHOD AND DATA COMPRESSION APPARATUS

(75) Inventor: Kazuya Matsuzawa, Minato-Ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 12/024,717

(22) Filed: Feb. 1, 2008

(65) Prior Publication Data

US 2008/0136687 A1  Jun. 12, 2008

Related U.S. Application Data

(62) Division of application No. 10/205,471, filed on Jul. 26, 2002, now Pat. No. 7,383,245.

(30) Foreign Application Priority Data

Jul. 27, 2001 (JP) .............................. 2001-227848

(51) Int. Cl.
*H03M 7/30* (2006.01)
(52) U.S. Cl. .............................. 341/50; 716/4; 707/101; 382/232
(58) Field of Classification Search ................... 341/50; 716/3, 4; 707/101; 382/190, 232
See application file for complete search history.

(56) References Cited

U.S. PATENT DOCUMENTS

| | | | |
|---|---|---|---|
| 5,631,975 A | * | 5/1997 | Riglet et al. ................. 382/173 |
| 6,480,124 B2 | * | 11/2002 | Shiba ........................... 341/50 |
| 6,973,217 B2 | | 12/2005 | Boliek et al. |

FOREIGN PATENT DOCUMENTS

| | | | |
|---|---|---|---|
| JP | 11-96207 | | 4/1999 |
| JP | 11242717 A | * | 9/1999 |

* cited by examiner

*Primary Examiner*—Howard Williams
(74) *Attorney, Agent, or Firm*—Oblon, Spivak, McClelland, Maier & Neustadt, L.L.P.

(57) ABSTRACT

A data compression apparatus has a characterizing point extracting part 1 which extracts data expressing characterizing points included in a plurality of data showing a result of carrying out simulation, quantized data generating part 2 which generates quantized data obtained by quantizing data except for data expressing characterizing points, and file number converting part 3 which converts the same types of quantized data including in the quantized data, into a relating file number. In the case of compressing data, data except for the characterizing points is compressed. If the same quantized data is included at the same address location in the previously-compressed file, the quantized data is replaced with the file number of previously-compression file, thereby compressing data at high efficiency.

9 Claims, 16 Drawing Sheets

| 9.19e+18 | 1.49e+18 | 2.48e+19 | 3.39e+19 | 2.21e+19 | 1.28e+19 | 9.19e+18 | 1.28e+19 |
| 2.92e+19 | 2.44e+19 | 4.33e+19 | 4.49e+19 | 3.97e+19 | 3.45e+19 | 2.92e+19 | 3.45e+19 |
| 9.46e+18 | 1.48e+19 | 2.41e+19 | 3.32e+19 | 2.72e+19 | 1.63e+19 | 9.46e+18 | 1.63e+19 |
| 2.48e+19 | 4.39e+19 | 2.48e+19 | 1.28e+19 | 3.39e+19 | 9.19e+18 | 2.48e+19 | 9.19e+18 |
| 4.33e+19 | 5.57e+19 | 4.33e+19 | 3.45e+19 | 3.51e+19 | 2.92e+19 | 4.33e+19 | 2.92e+19 |
| 2.41e+19 | 3.32e+19 | 2.41e+19 | 1.63e+19 | 3.32e+19 | 9.46e+18 | 2.41e+19 | 9.46e+18 |

FIG. 5

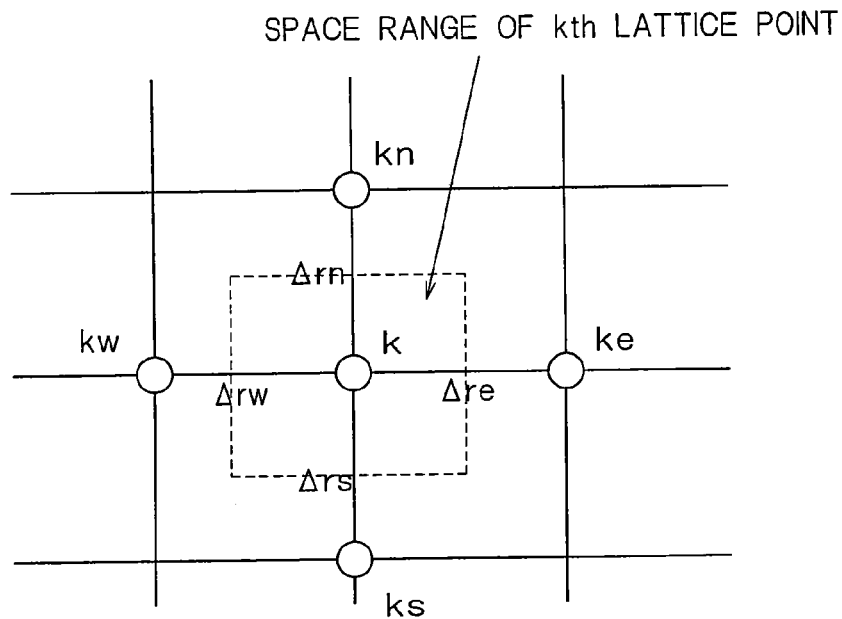
F I G. 11
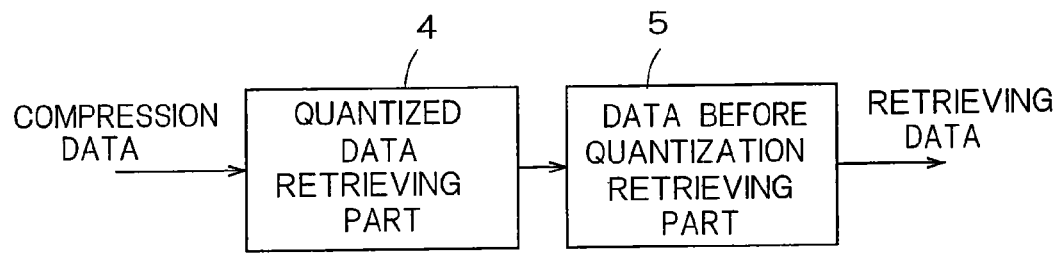
F I G. 12

DATA RETRIEVING METHOD, DATA RETRIEVING APPARATUS, DATA COMPRESSION METHOD AND DATA COMPRESSION APPARATUS

CROSS REFERENCE TO RELATED APPLICATIONS

This application is a divisional of and claims the benefit of priority under 35 U.S.C. § 120 from U.S. application Ser. No. 10/205,471, filed Jul. 26, 2002 and claims the benefit of priority under 35 U.S.C. § 119 from Japanese Patent Application No. 2001-227848, filed on Jul. 27, 2001, the entire contents of which are incorporated herein by reference.

BACKGROUND OF THE INVENTION

1. Field of the Invention

The present invention relates to a data compression method and a data retrieving method. For example, the present invention aims at a technique for compressing/retrieving data expressing a result of carrying out simulation.

2. Related Background Art

When designing semiconductor devices and so on, numerical analysis such as computer simulation became absolutely imperative. As structures to be designed become complex, the amount of data showing a computed result increases. The simulation is often carried out while changing simulation conditions such as an applied voltage and time. Because of this, it is necessary to preserve the simulation result for each of the different simulation conditions.

Conventionally, the simulation results were preserved as it is or after compressing the simulation results. As a method of performing the compression, a method of preserving the number of times of repetition of data "1" and "0" described by binary code is known.

When the amount of data increases, computer resources such as a hard disk drive is significantly consumed, and data management becomes complex and troublesome.

SUMMARY OF THE INVENTION

An object of the present invention is to provide a data compression method capable of compressing data at high compression ratio by a simplified method.

Furthermore, the other object of the present invention is to provide a data retrieving method capable of retrieving the compressed data at high compression ratio by a simplified method.

According to embodiments of the present invention, a data retrieving method of retrieving compression data including non-quantized data expressing characterizing points and quantized data except for said characterizing points, comprising:

carrying out simulation by setting said non-quantized data as fixed values, if necessary based on said quantized data; and retrieving data before quantization from said quantized data based on a result of carrying out said simulation.

Furthermore, according to embodiments of the present invention, a data retrieving method of retrieving compression data including non-quantized data expressing characterizing points, quantized data except for said characterizing points, and pointer data related to certain quantized data comprising:

converting said pointer data into the corresponding quantized data;

carrying out simulation by setting said non-quantized data as fixed values and an initial value based on said quantized data; and retrieving data before quantization from said quantized data based on a result of carrying out said simulation.

Furthermore, according to embodiments of the present invention, a data compression method, comprising:

extracting data expressing characterizing points from a plurality of data as objection of compression;

generating quantized data to quantize data except for data expressing said characterizing points among said plurality of data as objection of compression;

converting the same types of quantized data included in said quantized data into pointer data having the number of bits fewer than that of said quantized data, said pointer data being related to the corresponding quantized data.

Furthermore, according to embodiments of the present invention, a data retrieving apparatus which retrieves compression data including non-quantized data expressing characterizing points and quantized data except for said characterizing points, comprising:

a simulation part for carrying out simulation by setting said non-quantized data as fixed values and if necessary setting initial values based on said quantized data; and a first data retrieving part for retrieving data before quantization from said quantized data, based on a result of said simulation.

Furthermore, according to embodiments of the present invention, a data retrieving apparatus which retrieves compressing data including non-quantized data expressing characterizing points, quantized data except for said characterizing points, and pointer data related to certain quantized data, comprising:

a quantized data converting part which converts said pointer data into the corresponding quantized data;

a simulation part for carrying out simulation by setting said non-quantized data to be fixed values and initial values based on said quantized data; and a first data retrieving part for retrieving data before quantization from said quantized data based on the result of the simulation.

Furthermore, according to embodiments of the present invention, a data compression apparatus, comprising:

a data extraction part for extracting data expressing characterizing points from a plurality of data as objection of compression;

a quantized data generating part which generates quantized data obtained by quantizing data except for data expressing said characterizing points among said plurality of data as objection of compression; and a pointer converting part for converting the same types of quantized data included in said quantized data into pointer data having the number of bits fewer than that of the quantized data, said pointer data being related to the quantized data.

BRIEF DESCRIPTION OF THE DRAWINGS

FIG. 5 is a diagram showing an example of the loaded file;

FIG. 11 is a diagram showing a control volume;

FIG. 12 is a block diagram showing schematic configuration of one embodiment of a data retrieving apparatus according to the present invention;

DESCRIPTION OF THE PREFERRED EMBODIMENTS

Hereinafter, a data retrieving apparatus and a data compression apparatus according to the present invention will be more specifically described with reference to drawings. Furthermore, the present invention is never limited to the following embodiments, and can be modified in various forms.

First Embodiment

Figure 1:
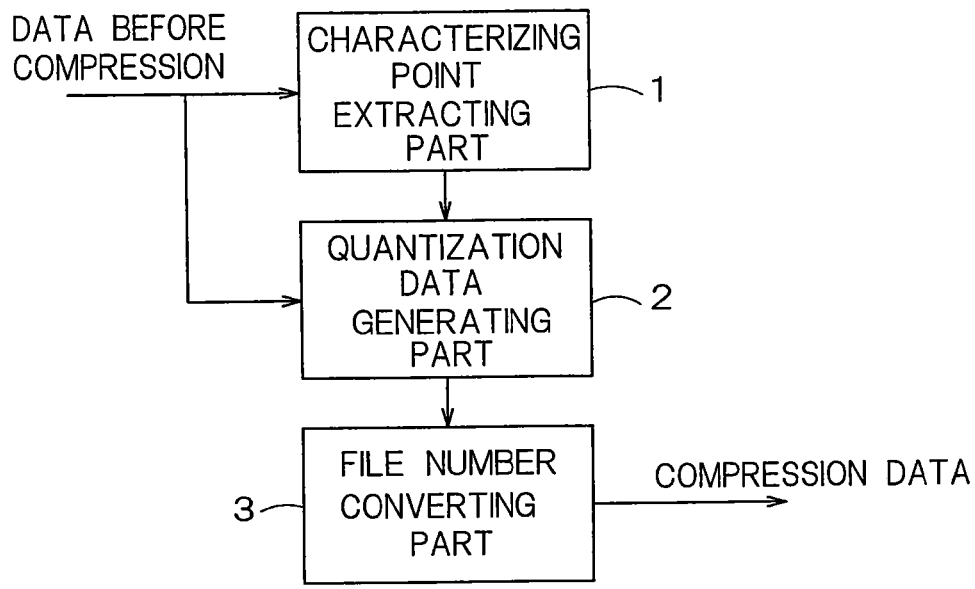
FIG. 1 is a block diagram of a first embodiment of a data compression apparatus according to the present invention.

FIG. 1 is a block diagram of a first embodiment of a data compression apparatus according to the present invention, which compresses a result of carrying out simulation.

This data compression apparatus has a characterizing point extracting part 1 for extracting data expressing characterizing points from a plurality of data expressing the result of carrying out the simulation, a quantized data generating part 2 for generating the quantized data obtained by quantizing data except for data expressing the characterizing points, and a file number converting part 3 for converting the same type of quantized data included in the quantized data into a relating file number.

Figures 2A, 2B:
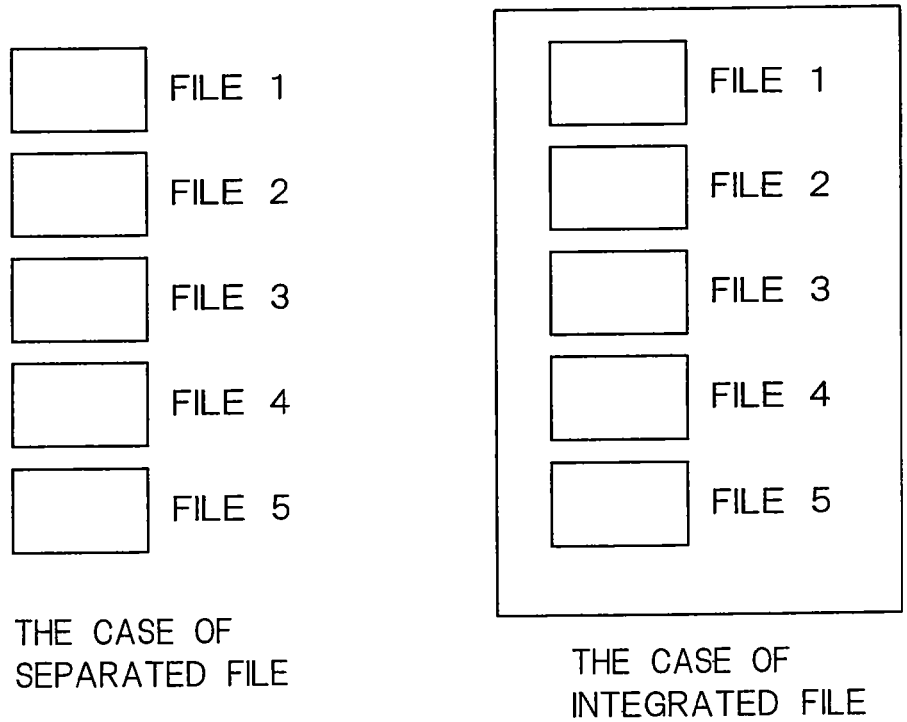
FIGS. 2A-2B are diagrams showing a plurality of files showing a result of carrying out simulation.

The result of carrying out the simulation inputted to the data compression apparatus of FIG. 1 includes N pieces of files sorted for each condition of the simulation. FIG. 2A shows an example of N=5. As shown in FIG. 2B, these N pieces of files may be divided by prescribed delimiter information and integrated into one consolidated file.

Figure 3:
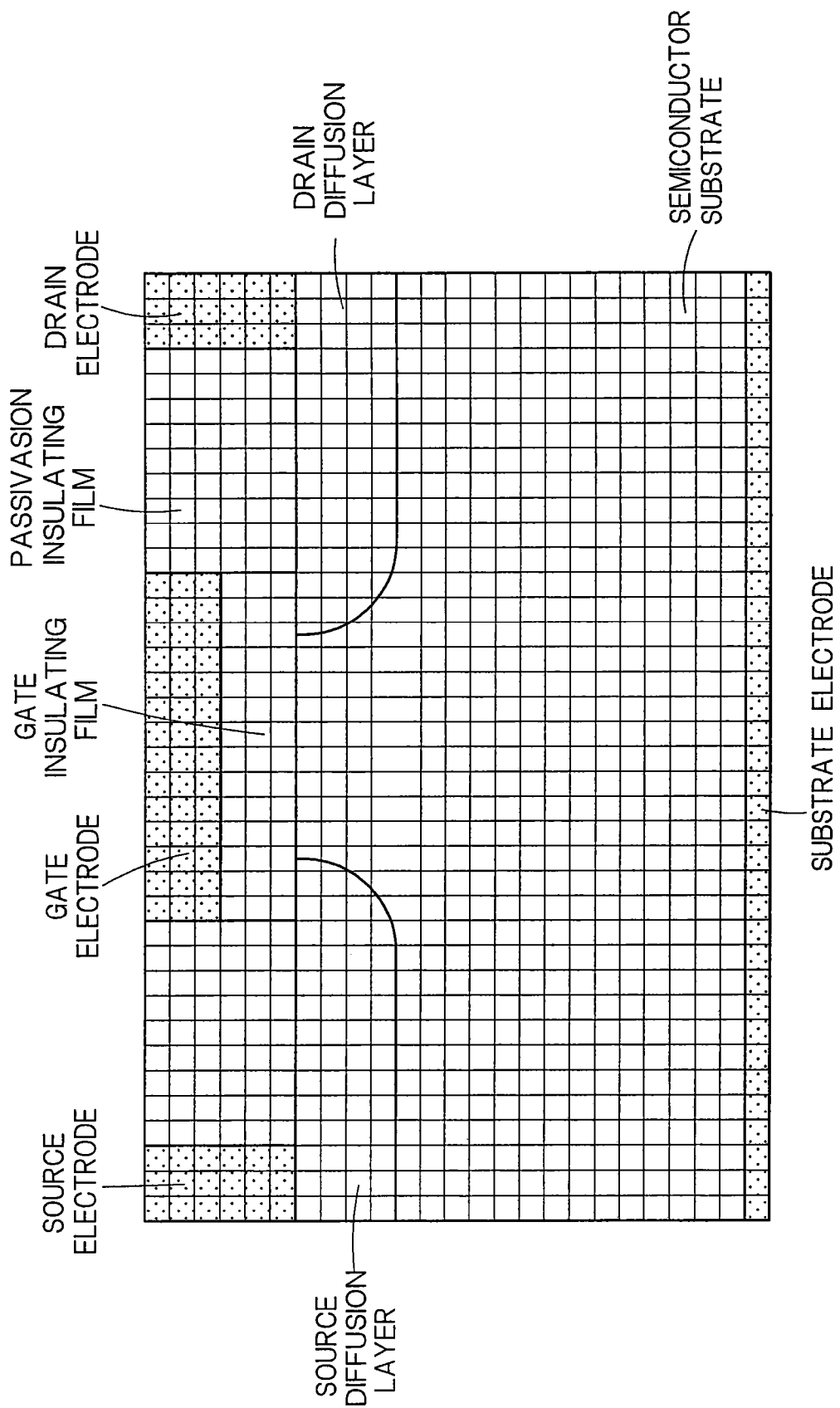
FIG. 3 is a diagram showing state in which simulation object is divided into mesh shape.

A simulation object is divided into mesh shape as shown in FIG. 3, and the data expressing the result of carrying out the simulation for each mesh is included in each file.

The simulation is carried out for each lattice point of the mesh or for each reference range enclosed by the mesh. The locations for carrying out the simulation is managed by addresses. For example, if assumed that each of lattice points of FIG. 3 is the location for carrying out the simulation, the result of carrying out the simulation for each address (they are also called index) expressing the locations of the lattice points is stored in the file.

Figure 4:
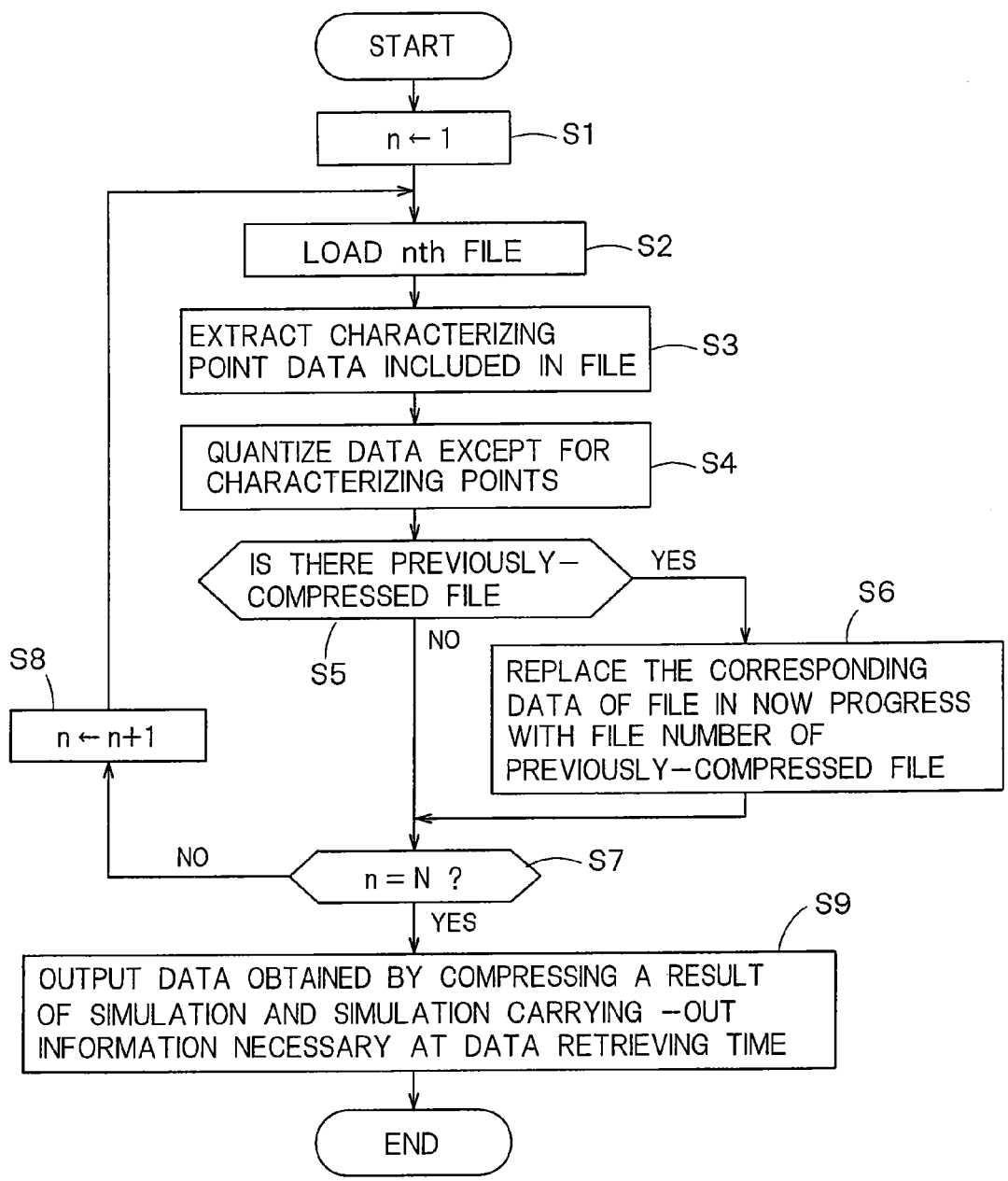
FIG. 4 is a flowchart showing processing procedure of a data compression apparatus of FIG. 1.

FIG. 4 is a flowchart showing processing operation of the data compression apparatus described in FIG. 1. First of all, if the compression requirement by users with regard to the result of carrying out the simulation is received, a variable n for counting the number of times of repetition of the processings is initially set to be "1" (step S1).

Next, nth file is loaded (step S2). "Load" means for performing some kind of processings for the file in order to carry out data compression. More specifically, the file is copied to a work memory of the computer, or is copied to a work region of a recording medium such as a hard disk drive. Or instead of copying the file by itself to the work memory and the recording medium, the system may only acquire the storing address of the file on the recording medium. Or after reading the file in the block into a temporary memory region, the flowchart of FIG. 4 may be carried out.

FIG. 5 is a diagram showing an example of the loaded file. A plurality of data corresponding to addresses showing the locations of carrying out the simulation is included in the file. That is, each data is managed by the addresses. Hereinafter, it will be simply assumed that all the data has the same data structure.

Next, the characterizing point extracting part 1 extracts data to be the characterizing points included in the file (step S3). The method of extracting the characterizing points will be described later.

Next, data except for the charactering points is quantized (step S4). The quantization is performed by using a conventional method. More specifically, the range of values of data candidate are divided into, for example, 256 levels, the level of the actual data is checked, and the quantization level is expressed by the binary code of 8 bits.

In numeric calculation such as the simulation, because the actual data is a real number value of 16-64 bits, by compressing it into data of about 8 bits at the stage of the quantization, it is possible to considerably reduce the amount of data.

Figure 6:
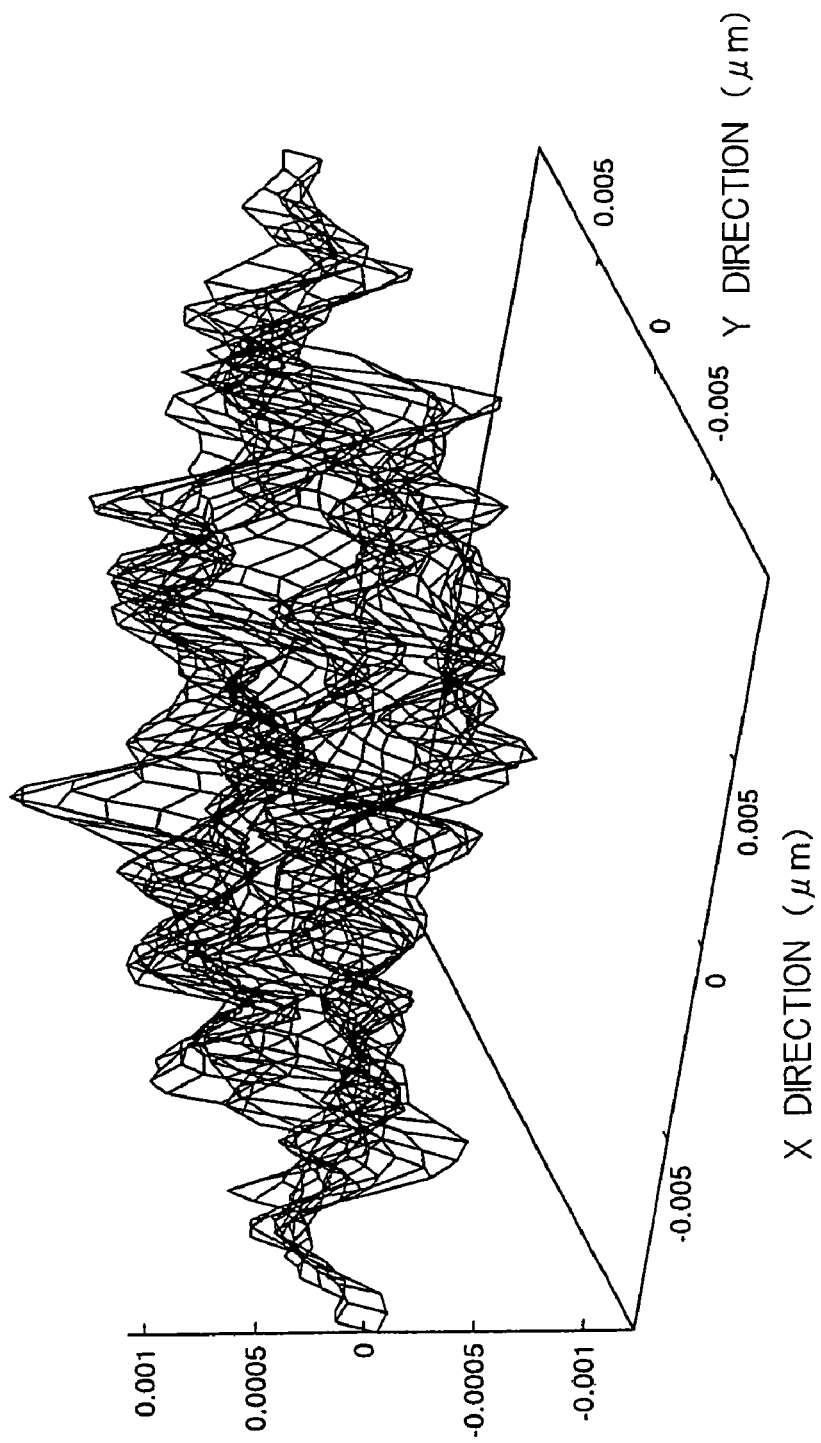
FIG. 6 is a diagram showing data distribution before quantization.
Figure 7:
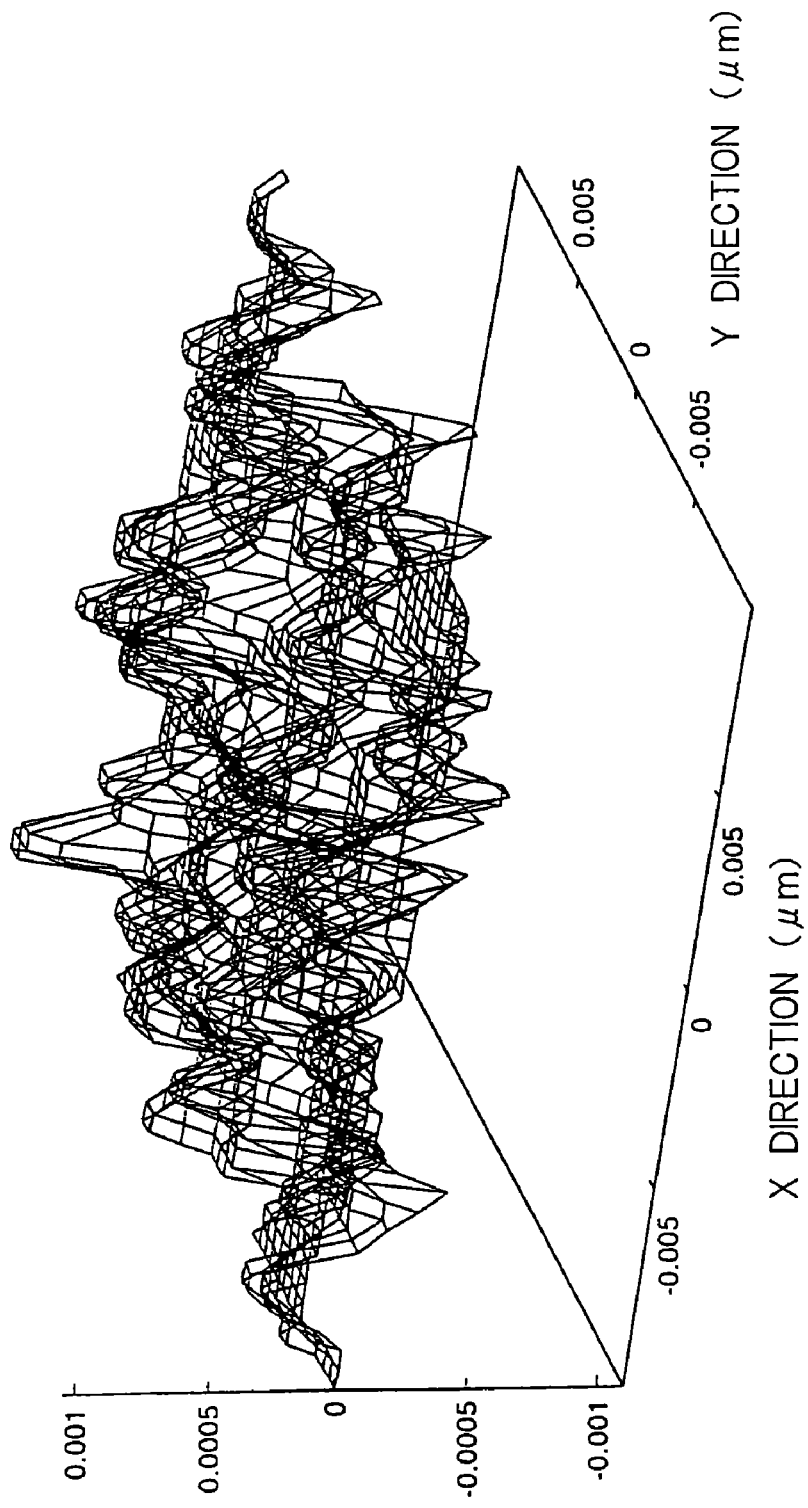
FIG. 7 is a diagram showing data distribution after quantization.

FIG. 6 is a diagram showing data distribution before the quantization, X and Y axes of 3D coordinates show X and Y coordinates, respectively, and Z axis shows physical quantity of data. When the quantization processing is performed for FIG. 6, a distribution such as FIG. 7 is obtained. Compared with the original distribution, the amplitude of the physical quantity is limited, and rough distribution is obtained. By such a quantization, it is possible to reduce the number of bits of data, and to compress data by itself. The method of retrieving the original distribution of FIG. 7 from the rough distribution of FIG. 6 will be described later.

After the quantization in step S4 of FIG. 4 is finished, it is determined whether or not there are the previously-compressed files (step S5). The determination processing is carried out only in the case of n>1, and the processing is omitted in the case of n=1. When there is the previously-compressed file, data in the file is compared with that in the file in now progress (step S6). More specifically, the data of the same address in both files are compared with each other. If the quatization level of both data compared with each other is the same, the corresponding data in the file in now progress is replaced with a pointer data (for example, file number) for designating the previously-compressed file.

Figure 8:
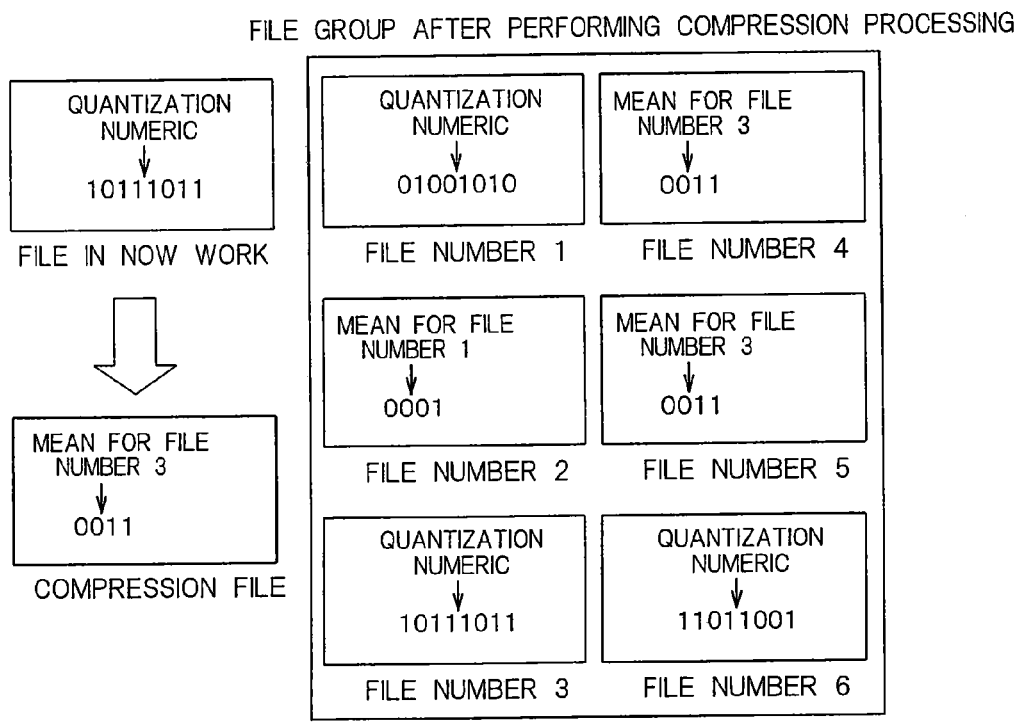
FIG. 8 is a diagram of describing processing procedure of step S6 described in FIG. 4.

FIG. 8 is a diagram for describing the processing contents of step S6. There are six pieces of data with file numbers 1-6 in the previously-compressed files. The quantized data "01001010" is stored in the file number 1, and the same data as that of the file number 1 is stored as the file number 2. In this case, practically, four bit data "0001" to intend for the file number 1 is stored as the file number 2. Similarly, the quantized data "10111011" is stored as the file number 3. The four bit data "0011" to intend for the same data as that of the file number 3 is stored as the file numbers 4 and 5. The quatization data "11011001" is stored as the file number 6.

If the data in now progress is the quatization data "10111011", which is the same data as that of the file number 3, its data is converted into four bits data "0011" to intend for the file number 3.

When determined that there is no previously-compressed file in step S5 of FIG. 4, or when the processing of step S6 is finished, it is determined whether or not a variable n is equal to a repeated maximum number N of the processings (step S7). If n<N, the variable n is counted up by "1" (step S8), and then the processings after step S1 are repeated. If n=N, data obtained by compressing the result of carrying out the simulation and simulation operation information necessary when retrieving data are outputted (step S9). Here, the simulation operation information is, for example, input files of the simulation, a name of a simulator used for carrying out the simulation and a version number of the simulator.

Figure 9:
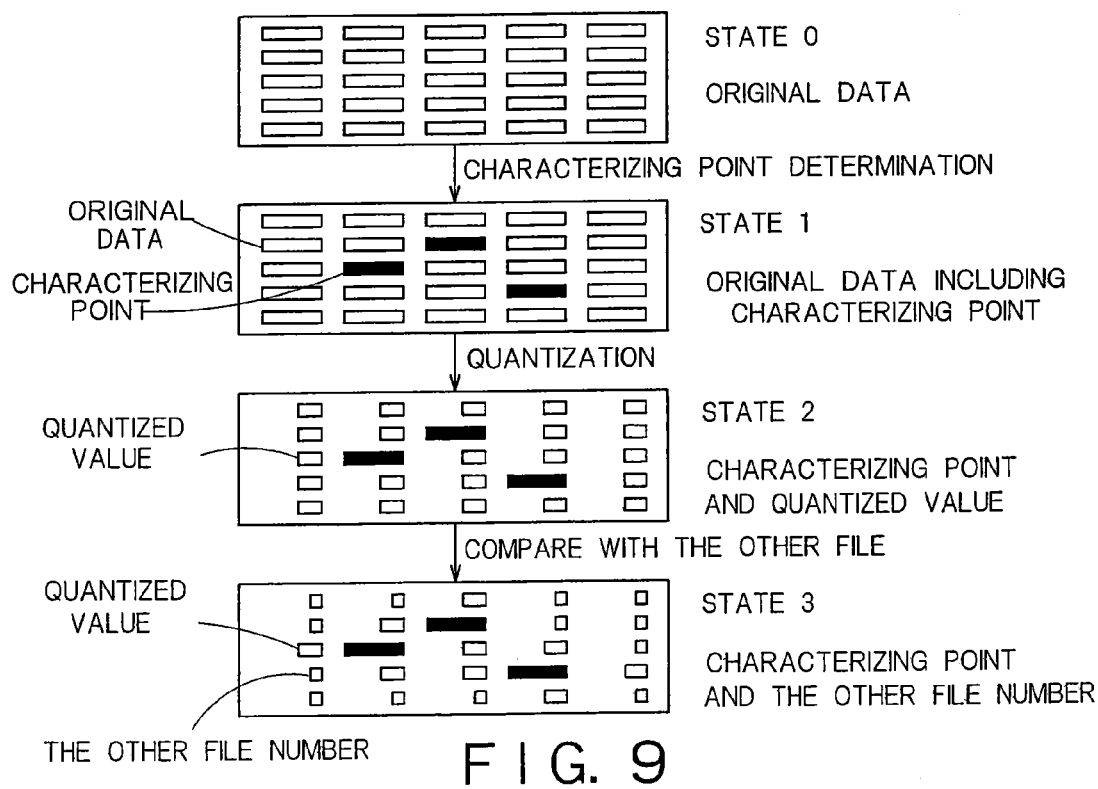
FIG. 9 is a diagram in which processing procedure of data compression is modified.

FIG. 9 is a diagram of modifying the processing procedure of data compression. First of all, the file before compression including a plurality of data is loaded (state 0), and then the characterizing points are extracted (state 1). In FIG. 9, data of the characterizing points is displayed by black color, and the other data is displayed by white color.

Next, data except for the characterizing points is converted into the quantized data (state 2). Next, if the previously-compression data is existed in data in now progress, the data is converted into the file number of the previously-compression data.

Figure 10:
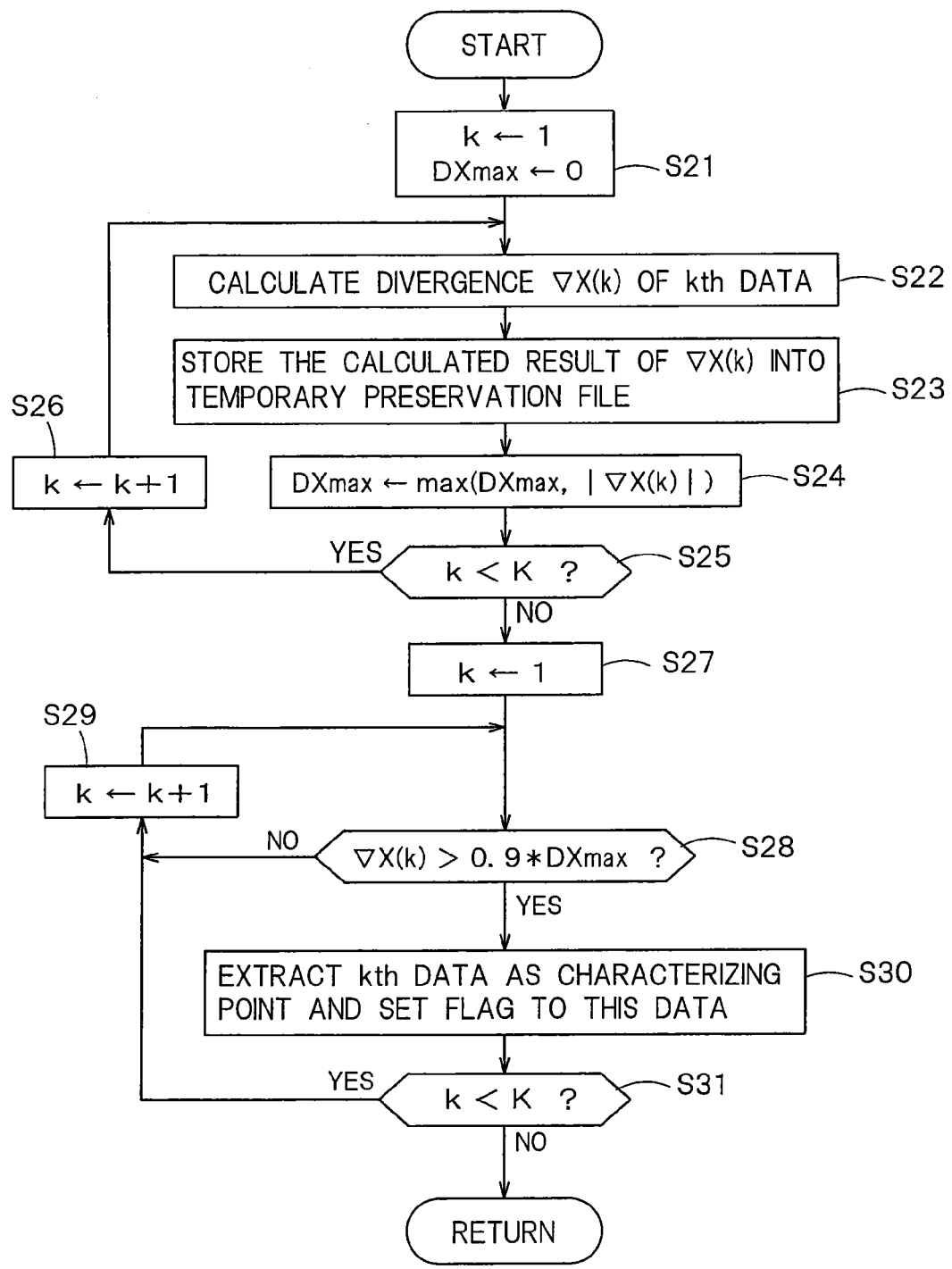
FIG. 10 is a flowchart showing a characterizing point extracting processing in step S3 described in FIG. 4.

FIG. 10 is a flowchart showing the characterizing point extraction processing of step S3 described in FIG. 4. This flowchart aims at data expressing space distribution of the physical quantity, detects points in which space variation of the space distribution is sharpest, and sets data within 90% of these points as the characterizing points.

First of all, a variable k is initialized to "1", and a divergence maximum value DXmax is initialized to "0" (step S21). Next, the divergence $\nabla X(k)$ of kth data is calculated (step S22). The calculation of divergence is, for example, as shown in FIG. 11, performed based on a control volume method of equation (1).

$$\nabla X(k) = \delta x^*(Xkn-Xk)/\Delta rn + \delta x^*(Xks-Xk)/\Delta rs + \delta y^*(Xke-Xk)/\Delta re + \delta y^*(Xkw-Xk)/\Delta rw \quad (1)$$

Here, $\delta x$ and $\delta y$ are expressed by equations (2) and (3), respectively.

$$\delta x = 0.5^*(\Delta rw + \Delta re) \quad (2)$$

$$\delta y = 0.5^*(\Delta rn + \Delta rs) \quad (3)$$

The calculation result of the divergence $\nabla X(k)$ is stored into the temporary preservation file (step S23). Next, if the calculation result is larger than DXmax, the calculation result of $\nabla X(k)$ is substituted into DXmax (step S24). The "max( )" in the flowchart of FIG. 10 is a function for returning a maximum value in arguments.

Next, it is determined whether or not to be k<K (step S25). If YES, the variable k is incremented by "1", and then the processings after step S22 is repeated. If NO, the variable k is initialized to "1" (step S27).

Next, it is determined whether or not to be $\nabla X(k) > 0.9^*DXmax$ (step S28). If NO, the variable k is incremented by "1" (step S29), and the processing of step S28 is repeated. If YES, kth data is extracted as the characterizing point, and a flag is set to this data (step S30).

Next, it is determined to be k<K (step S31). If YES, the variable k is incremented by "1", and the processing of step S28 is performed. If NO, the processing for extracting the characterizing point is finished, and the processing of step S4 of FIG. 4 is performed.

Thus, in the flowchart of FIG. 10, the divergence $\nabla X(k)$ is calculated for each data in the file. After the divergence maximum value DXmax is calculated, all the data having the divergence equal to or more than 90% of the divergence maximum DXmax is extracted as the characterizing points.

The characterizing points are necessarily not locations having large divergence. The characterizing points may be extracted based on simply data size. Or the characterizing points may be extracted based on the other methods.

Thus, in the first embodiment, when the data is compressed, the data except for the characterizing points is quantized, and when the same quantized data is included at the same address location of the previously-compressed file, the quantized data is replaced with the file number of the previously-compressed file. Therefore, it is possible to compress data at high efficiency.

Second Embodiment

A second embodiment retrieves data compressed by the method described in the first embodiment into the original data.

FIG. 12 is a block diagram showing schematic configuration of an embodiment of a data retrieving apparatus according to the present invention. The data retrieving apparatus of FIG. 12 has a quantized data retrieving part 4 for converting the other file numbers in the compression file into the quantized data, and a data retrieving part before quantization 5 which carries out simulation by setting non-quantized data (data expressing characterizing points) in the compression file as fixed values and setting quantized data (data except for characterizing points) in the compression file as initial values, and retrieves data before quantization from quantized data in the compression file.

Figure 13:
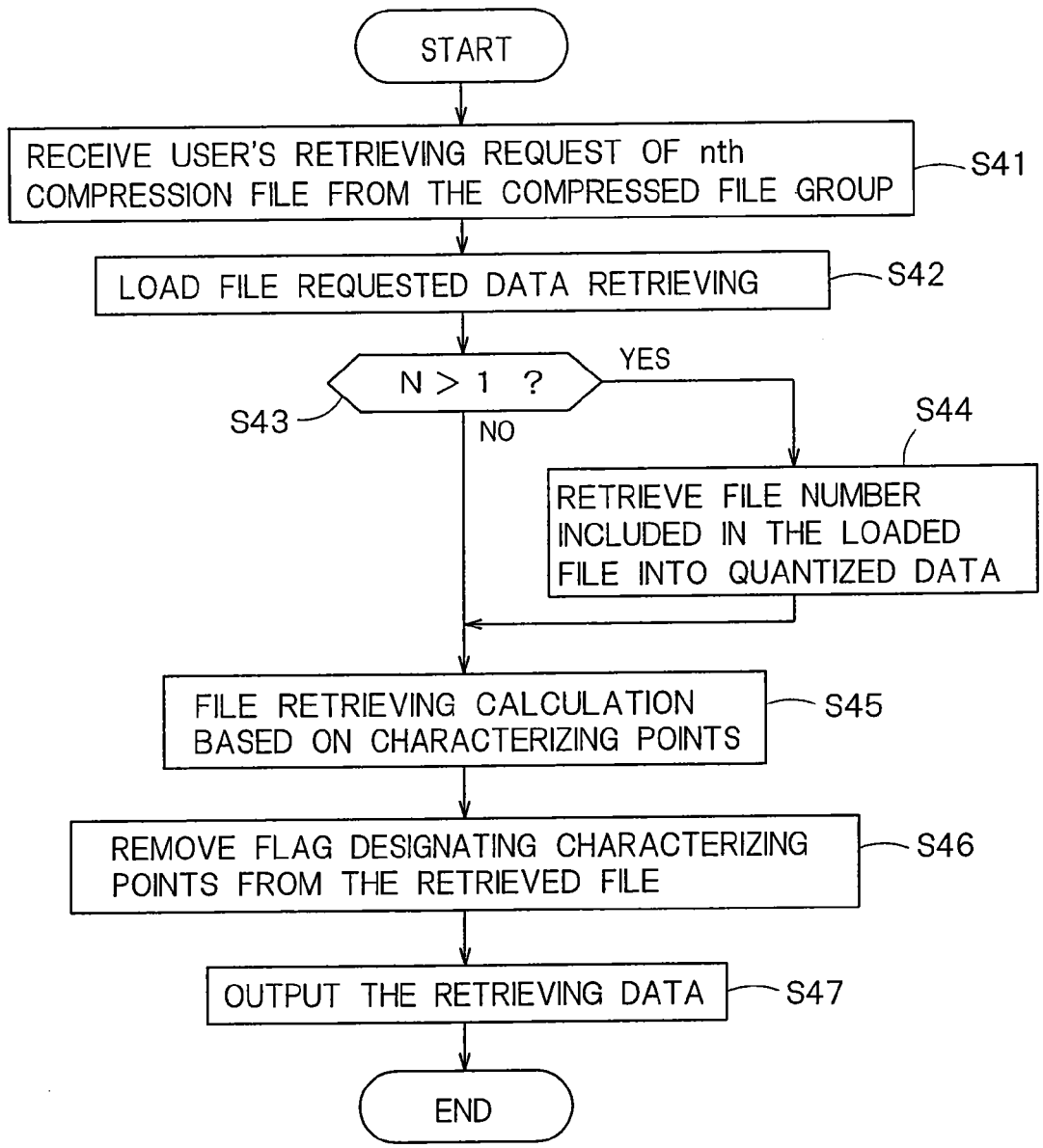
FIG. 13 is a flowchart showing processing procedure of a data retrieving apparatus described in FIG. 12.

FIG. 13 is a flowchart showing processing procedure of the data retrieving apparatus described in FIG. 12. First of all, user's retrieving request of nth compression file from the compressed file group is accepted (step S41), the file is loaded (step S42).

Next, it is determined whether or not the total numbers N of files is larger than "1" (step S43). If YES, the file number included in the loaded file is retrieved into the original quantized data (step S44).

When determined NO in step S43, because the file number is never included in the file, the processing of step S44 is omitted. If determined NO in step S43, or the processing of step S44 is finished, the retrieving calculation of the file is performed based on the characterizing points (step S45). A detail of the retrieving calculation will be described later. Next, the flag for designating the charactering points is removed from the retrieved file (step S46), and then the retrieving data is outputted (step S47).

Figure 14:
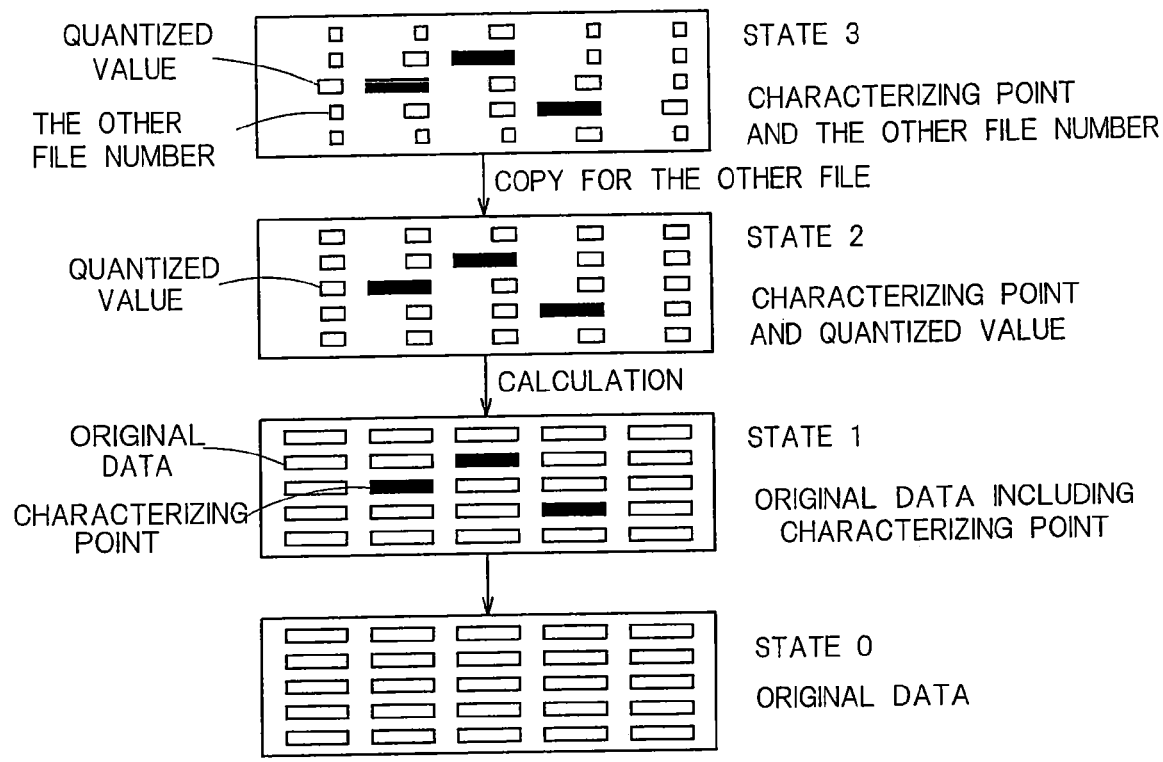
FIG. 14 is a diagram in which processing procedure of retrieving data is modified.

FIG. 14 is a diagram of modifying processing procedure of retrieving data. Non-quantized data expressing the characterizing points, quantized data except for the characterizing points, and the other file numbers except for the characterizing points are mixed in the compression file before retrieving data (state 3).

First of all, the other file numbers are converted into the corresponding quantized data (state 2). Next, the characterizing points are set as fix values, and the quantized data is converted into real values as initial values. The simulation is carried out based on together preserved simulation information. Therefore, the quantized data is retrieved into the original data, and the original smooth distribution as shown in FIG. 6 is retrieved based on the rough distribution as shown in FIG. 7 (state 1).

Next, the flags designating the characterizing points are removed from the retrieved file to output the retrieving data (state 0).

As shown in the present embodiment, by setting the charactering points as the fixed value and the quantized data as the initial value, it is possible to begin the calculation from the state near a real value, and to obtain data distribution at 10 times speed than that of the ordinary simulation.

Furthermore, because only the system in which applications such as the simulator are installed can retrieve data until level one, it is possible to prevent data steal, thereby improving security performance.

Figure 15:
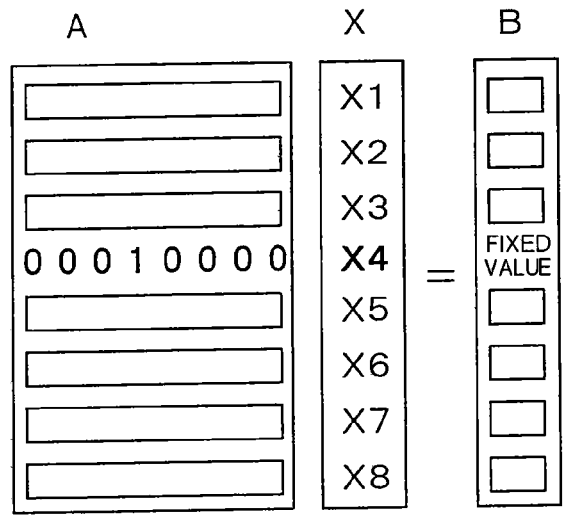
FIG. 15 is a diagram showing a general equation of matrix solution.

A method of retrieving data from state 2 to state 1 of FIG. 14 will be hereinafter described in detail. In the simulation, the equation to be solved is often converted into an algebraic equation by performing discrete processing, and answers are obtained by matrix solution. The calculation procedure is described as AX=B by matrix form, as shown in FIG. 15. A is a matrix of K*K, X and B are a column vector having K pieces of elements, and X is an unknown letter.

It is assumed that the element X4 of the column vector X of k=4 is the characterizing point. In this case, if 4 lines 4 columns of the matrix A are "1" and all the columns of the same line are "0", the 4th element of the column vector B becomes fixed value.

In the present embodiment, data which is the elements except for X4 in the column vector X and except for the characterizing points is set to be the initial value converted from the quantized data into a real number.

Figures 16, 17, 18:
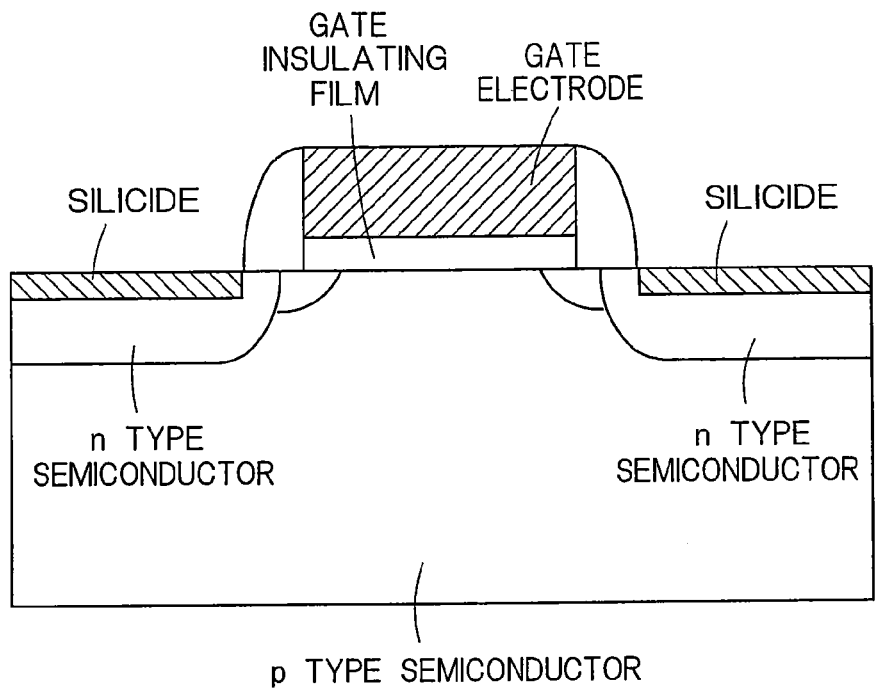
FIG. 16 is a cross sectional diagram of a transistor for describing one example of semiconductor analysis.
FIG. 17 is a diagram showing physical quantity of the surrounding lattice points of the characterizing points having the physical quantity X4.
FIG. 18 is a diagram showing physical quantity of the surrounding lattice points of the characterizing points having the physical quantity $\phi$.

For example, in analysis of a semiconductor device as shown in FIG. 16, it is assumed that lattice points included in the illustrated regions are the characterizing points with regard to the physical quantity X. Data compression by the quantization or the replacement of the file number is not performed with regard to the physical quantity X on these lattice points. The physical quantity of one characterizing point in the region of FIG. 16 is set to be X4.

In the case of analyzing two dimension structure, as generally shown in FIG. 17, an algebraic equation as shown in equation (4) is derived on the characterizing points by using the physical quantities XN, XS, X3 and X5 on the lattice points from right to left or up and down of the physical points having the physical quantity X4.

$$AN \cdot XN + A3 \cdot X3 + A4 \cdot X4 + A5 \cdot X5 + AS \cdot XS = B4 \quad (4)$$

The equation (4) is the equation in the case that a value of X4 is not decided and the case of performing the calculation by taking into consideration interactions between the surrounding lattice points. When the lattice point having the physical quantity X4 is the characterizing point, and it is unnecessary to update the value X4, that is, X4 is dealt as a fixed value, X4 becomes the fixed value by setting to be A4=1, A5=0, AS=0 and B4=fixed value.

When the values of the lattice points except for X4, for example, XN or X5 are not the characterizing point, these values are the quantized value, and deteriorate compared with the original real value. However, because XN and X5 are values near the original values, these values are substituted for the corresponding element of the column vector of X of FIG. 15 as the initial value. In this stage, because left side and right side of a determinant of FIG. 15 are not equal to each other, by using the ordinary matrix solution, the elements of X column vector are approximated the real value by repeated calculation so that left side becomes equal to right side.

At this time, the values of the characterizing points are not at all updated between the repeated calculation. Generally, there is a characteristics in which periphery of points which are not updated gets close to the real value by a few repeated calculation. Because of this, it is expected that as the characterizing points are abound, the repeated number of times decreases.

Furthermore, with regard to the physical quantity on the lattice points except for the characterizing points, although the physical quantity may not be a real value, a value near the real value is given as the initial value. Because of this, it is expected that the real value is obtained by a few repeated calculation in totality.

For example, a method of mathematically solving Poisson equation of the following equation (5) by matrix solution will be described hereinafter.

$$\nabla \cdot \epsilon \nabla \Psi = -q(p-n+Nd-Na) \quad (5)$$

Here, $\epsilon$ is permittivity, $\Psi$ is potential, q is unit elementary charge, p is hole density, n is electron density, Nd is donor density, and Na is accepter density.

When equation (5) is numerically solved by matrix solution, discrete processing of equation (5) is performed. For example, as shown in FIG. 18, when four lattice points of from right to left or up and down of the characterizing points with the physical quantity $\Psi 4$ have the physical quantities $\Psi N, \Psi S, \Psi 3$ and $\Psi 5$, respectively, equation (6) is obtained by the discrete processing of equation (5).

$$AN\Psi N + A3\Psi 3 + A4\Psi 4 + A5\Psi 5 + AS\Psi S = B4 \quad (6)$$

Here, each parameter of equation (4) is expressed by equations (7)-(14).

$$AN = \epsilon n \delta / \Delta rn \quad (7)$$

$$AS = \epsilon s \delta / \Delta rs \quad (8)$$

$$A3 = \epsilon e \delta / \Delta re \quad (9)$$

$$AS = \epsilon s \delta / \Delta rw \quad (10)$$

$$A4 = -AN - AS - A3 - A5 \quad (11)$$

$$B4 = -\delta x \delta y (p4 - n4 + Nd4 - Na4) \quad (12)$$

$$\delta x = (\Delta re + \Delta rw)/2 \quad (13)$$

$$\delta y = (\Delta rn + \Delta rs)/2 \quad (14)$$

In the present embodiment, if X4 is a fixed point, X4=fixed value is established by setting to be AN=0, A3=0, A4=1, A5=0, AS=0 and B4=fixed value.

Thus, in the second embodiment, data of the characterizing point is set to be the fixed value, the initial value which converts data except for the characterizing points from the quantized data into real number is set, and then the repeated calculation by the simulation is performed to retrieve the original data. Because of this, it is possible to shorten the processing time necessary for retrieving data.

In principle, it is possible to retrieve the original data if there is only data of the characterizing points. Because of this, without setting the above-mentioned initial value, the simulation may be performed by setting data of the characterizing points as the fixed value. In this case, compared with the case of setting the initial value, it takes too much time until the solution converges. Accordingly, if data retrieving at high speed is required, as described above, data of the characterizing points is set to be the fixed value, the initial value which converts data except for the characterizing points from the quantized data into real number is set, and then the repeated calculation by the simulation may be performed to retrieve the original data.

Third Embodiment

A third embodiment does not preserve the physical quantity capable of retrieving data based on a prescribed retrieving rule, thereby reducing the amount of data to be preserved.

Figure 19:
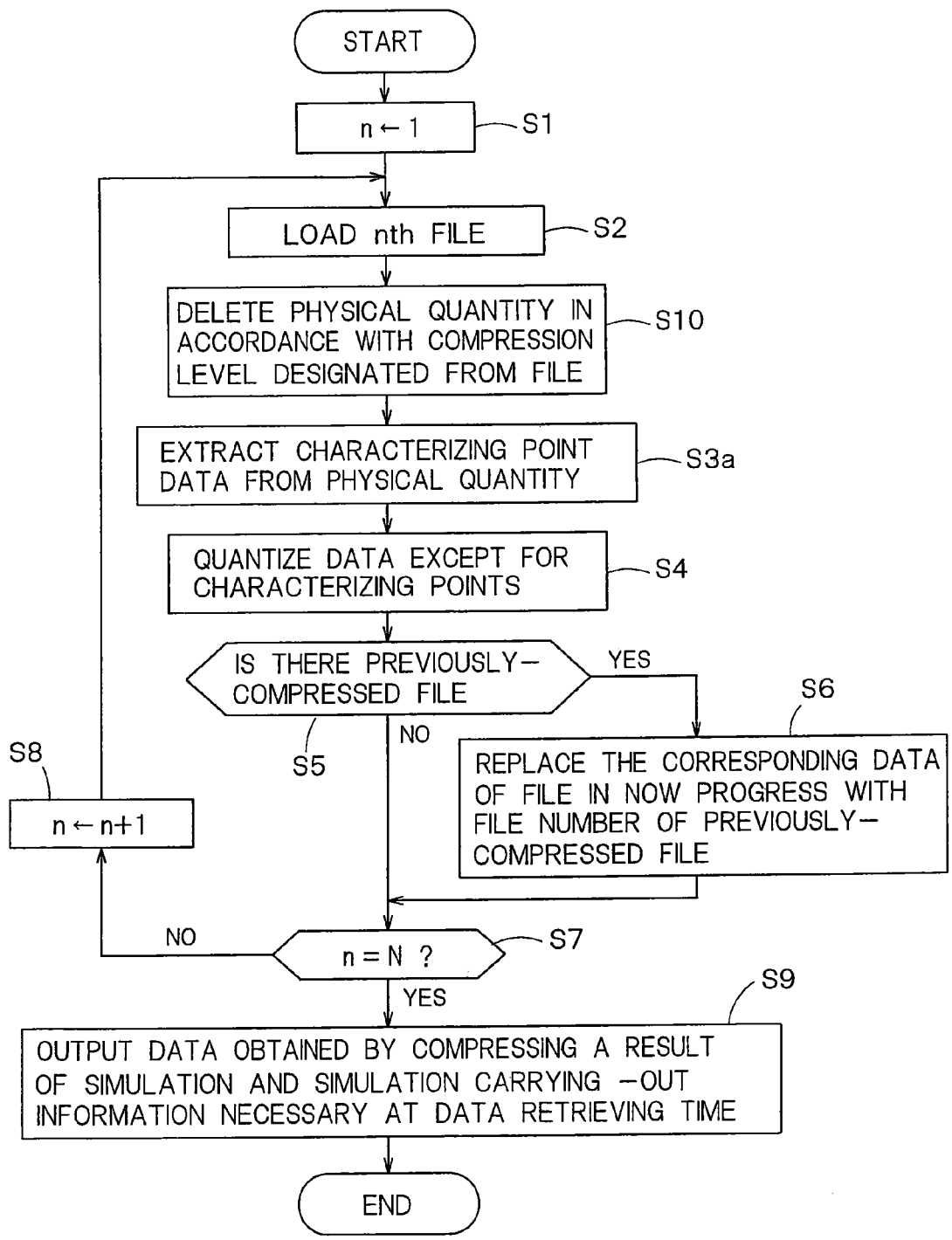
FIG. 19 is a flowchart showing data compression processing procedure in a second embodiment of the present invention.

FIG. 19 is a flowchart showing data compression processing procedure in the third embodiment according to the present invention. The flowchart of FIG. 19 performs the processing of step S10 after the processing of step S2, and then performs step S3a instead of step S3, compared with the flowchart of FIG. 4.

In step S10, the physical quantity is deleted in accordance with the designated compression level from the loaded file. For example, there are seven types of levels 1-7, and compression ratio is different for each level. As the compression ratio is high, the deleted physical quantity increases.

In step S3a, data of the characterizing points is extracted from the physical quantity not deleted in the file. When the processing of step S3a is finished, the same processings as those of step S4-S9 of FIG. 4 are performed.

Figure 20:
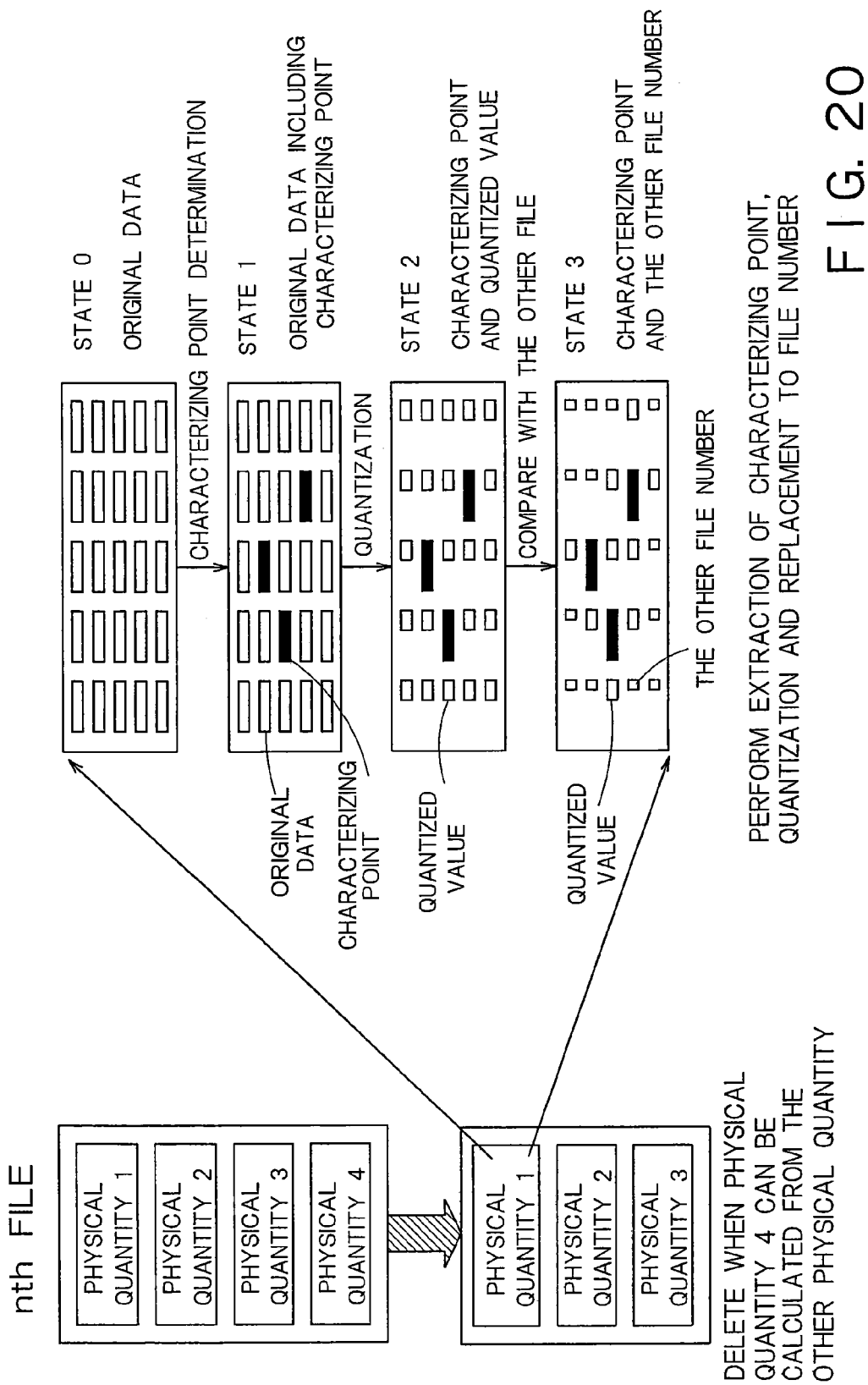
FIG. 20 is a conceptual diagram of data compression processing procedure described in FIG. 19.

FIG. 20 is a conceptual diagram of data compression processing procedure described in FIG. 19. It is assumed that the physical quantities 1-4 exist in nth file. For example, the physical quantity 4 is deleted in accordance with the designated compression level, and extraction of the characterizing points, quantization and replacement to file number are carried out with regard to the remaining physical quantities 1-3.

Figure 21:
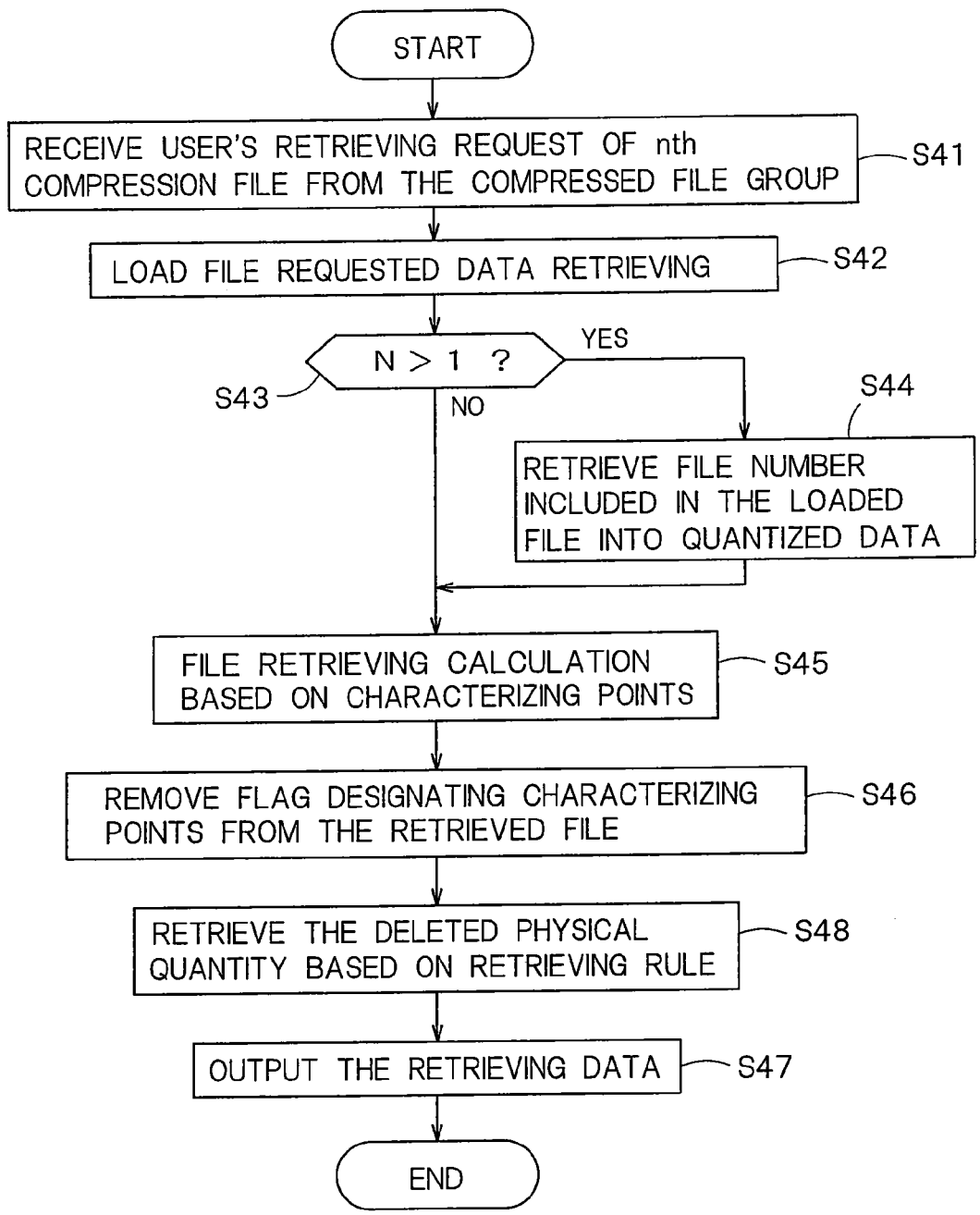
FIG. 21 is a flowchart showing data compression processing procedure in a third embodiment of the present invention.

FIG. 21 is a flowchart showing data retrieving processing procedure in the third embodiment according to the present invention. The flowchart of FIG. 21 performs the processing of step S48 after the processing of step S46, and performs the processing of step S47 after the processing of step S48, compared with the flowchart of FIG. 13.

In step S48, the deleted physical quantity is retrieved based on a prescribed retrieving rule. Here, the retrieving rule is a rule for retrieving the physical quantity not preserved, and is derived from the physical model.

Figure 22:
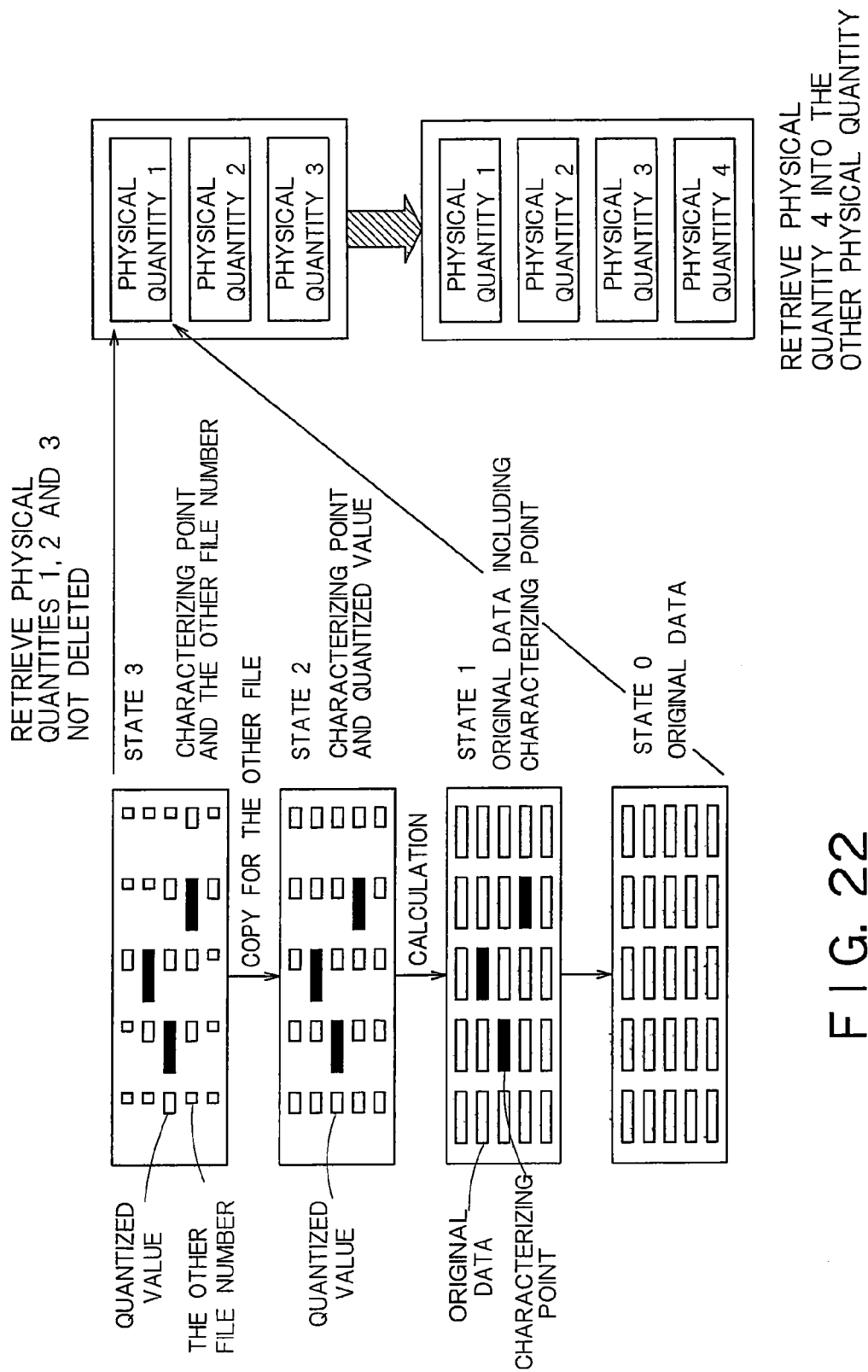
FIG. 22 is a conceptual diagram of data retrieving processing procedure described in FIG. 21.

FIG. 22 is a conceptual diagram of data retrieving processing procedure described in FIG. 21. First of all, the other file number is converted into the quantized data, and then data before quantization is retrieved based on the characterizing points and the quantized data. Next, the deleted physical quantity 4 is retrieved based on the physical quantities 1-3 not deleted.

Thus, in the third embodiment, the physical quantity easily obtained by the simulation is not preserved. Because of this, it is possible to reduce the amount of data preservation and to save storage area of a recording medium.

The above-mentioned data compression apparatus and data retrieving apparatus may be composed of hardware or software. In the case of being composed of software, the program for realizing the function of the data compression apparatus and data retrieving apparatus may be contained in recording mediums such as a floppy disk or a CD-ROM, in order to be read out and execute by a computer. The recording medium is not limited to portable type of mediums such as magnetic disks or optical disks. The fixed type of mediums such as a hard disk drive or a semiconductor memory may be used.

The program for realizing the function of the above-mentioned data compression apparatus and data retrieving apparatus may be delivered via communication lines including radio communication such as an internet. Furthermore, the program may be delivered at a state of encoding, modulating or compressing the program, via a fixed-line or radio-line such as the Internet, or while containing the program in the recording medium.

What is claimed is:

1. A data compression method, comprising:
    extracting data expressing characterizing points from a plurality of data as objection of compression;
    generating quantized data to quantize data except for data expressing said characterizing points among said plurality of data as objection of compression;
    converting the same types of quantized data included in said quantized data into pointer data having the number of bits fewer than that of said quantized data, said pointer data being related to the corresponding quantized data.

2. The data compression method according to claim 1,
    wherein data according to the designated compression level is deleted from said plurality of data as objection of compression; and
    data expressing said characterizing points is extracted from data except for said deleted data, among said plurality of data as objection of compression.

3. The data compression method according to claim 1, wherein said plurality of data as objection of compression are data showing a result of simulation.

4. The data compression method according to claim 3,
    wherein a maximum value of divergence showing a location where space variation of space distribution is sharpest is detected among said plurality of data as objection of compression; and
    data with the divergence value in which ratio for the maximum value of divergence is equal to or more than a prescribed value is extracted as said characterizing points.

5. The data compression method according to claim 1, wherein data expressing said characterizing points is extracted by setting a maximum value of variation ratio for a maximum value of data or the adjacent relating data as a reference.

6. The data compression method according to claim 1,
    wherein each of said quantized data is managed by file number; and
    said pointer data is file number of the quantized data except for the corresponding quantized data.

7. The data compression method according to claim 6, wherein said pointer data expresses each simulation location in the case of carrying out simulation by dividing a simulation object in mesh shape.

8. A data compression apparatus, comprising:

a data extraction part for extracting data expressing characterizing points from a plurality of data as objection of compression;

a quantized data generating part which generates quantized data obtained by quantizing data except for data expressing said characterizing points among said plurality of data as objection of compression; and a pointer converting part for converting the same types of quantized data included in said quantized data into pointer data having the number of bits fewer than that of the quantized data, said pointer data being related to the quantized data.

9. The data compression apparatus according to claim 8, further comprising data deleting part for deleting data according to the designated compression level;

wherein said data extracting part extracts data expressing said characterizing points included in data except for said deleted data among said plurality of data as objection of compression.

* * * * *